United States Patent [19]

Nutz

[11] 4,435,651
[45] Mar. 6, 1984

[54] ZERO VOLTAGE SWITCH

[75] Inventor: Karl-Diether Nutz, Oedheim, Fed. Rep. of Germany

[73] Assignee: Telefunken electronic GmbH, Heilbronn, Fed. Rep. of Germany

[21] Appl. No.: 309,516

[22] Filed: Oct. 7, 1981

[30] Foreign Application Priority Data

Oct. 7, 1980 [DE] Fed. Rep. of Germany ....... 3037794

[51] Int. Cl.³ .................... H03K 17/72; H03K 17/13; H03K 5/153
[52] U.S. Cl. .......................... 307/252 UA; 307/252 B; 307/354
[58] Field of Search ............ 307/252 B, 252 UA, 261, 307/354, 264, 268; 323/235, 237, 319; 363/54, 57

[56] References Cited
U.S. PATENT DOCUMENTS
3,925,688 12/1975 Kalfus .......................... 307/252 UA
4,132,909 1/1979 Nutz ..................................... 307/354

FOREIGN PATENT DOCUMENTS
1137479 10/1962 Fed. Rep. of Germany .
2735736 3/1979 Fed. Rep. of Germany .

Primary Examiner—John Zazworsky
Attorney, Agent, or Firm—Spencer & Frank

[57] ABSTRACT

A zero voltage switch comprises two parallel connected current branches for taking over the D.C. current from a D.C. current source in half cycles of an A.C. voltage and a third current branch for blocking the other two current branches in zero axis crossing phases of the A.C. voltage so as to produce control pulses, a logic unit being provided for controlling the D.C. current source whereby an extremely small current is provided up to the beginning of a first control pulse, an increased current is provided during the control pulses and an intermediate current is provided between the control pulses.

11 Claims, 7 Drawing Figures

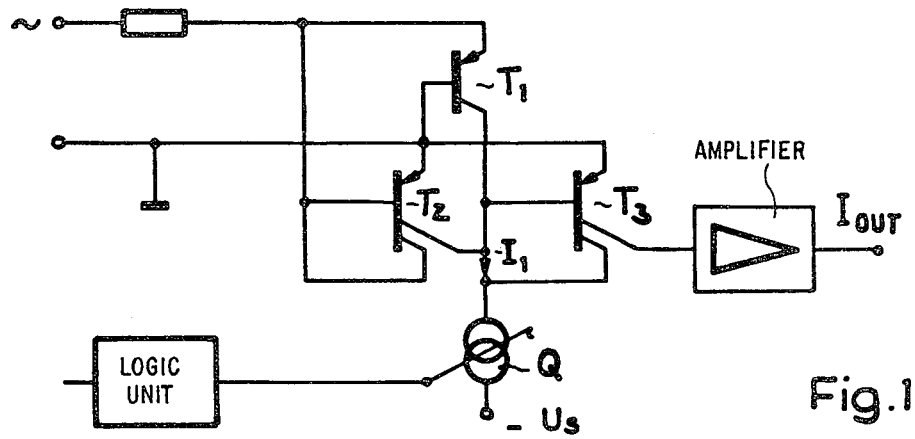
Fig.1
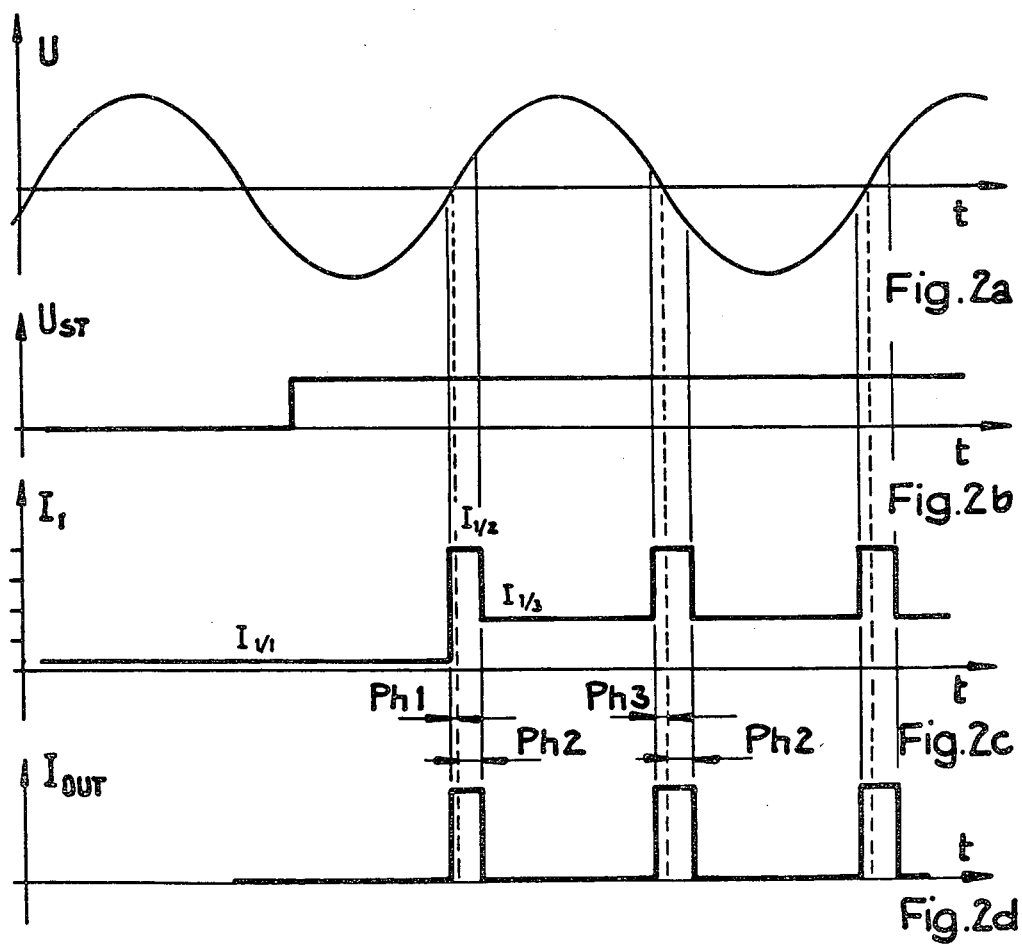
Fig.2a
Fig.2b
Fig.2c
Fig.2d

ZERO VOLTAGE SWITCH

BACKGROUND OF THE INVENTION

The invention relates to a zero voltage switch, comprising two parallel connected current branches each of which takes over a direct current provided by a current source in one half wave of the alternating voltage, this direct current being coupled out for the purpose of producing control pulses via a third current branch in the zero crossing phases of the alternating voltage, during which phases both current branches are blocked. The invention is particularly suitable for triggering a triac. Such a circuit is known for example from German Offenlegungsschrift No. 25 53 764.

Zero voltage switches are used, by way of example, to trigger full-wave thyristors (triacs). The triac is to be triggered during the zero axis crossing of an alternating voltage signal in order to reduce to a minimum as far as possible the disturbances in the alternating current mains which are caused by switching. Therefore, in the case of the known zero axis crossing detector, the pulses which ensure that the triac is conductive are produced during the zero axis crossing phase of the alternating voltage and the pulse width is distributed uniformly between the positive and negative half waves of the alternating voltage signal. This uniformity is achieved by providing the zero axis crossing detector with two current paths which are connected in parallel and are provided with bi-polar transistors. These current paths each taking over a direct current supplied by a constant current source in one half wave in each case of the alternating voltage, the direct current being coupled out via a third transistor only in the zero axis crossing phase and serving to produce the output pulses.

The known circuit is equipped with multi-collector current image transistors which ensure that the output pulses are exactly symmetrical at the zero axis crossing of the alternating voltage. In the known circuit, the alternating voltage is still so large, when the first control pulse is triggered after a switching command has been received, that high frequency disturbance is triggered by phase gating in the half wave which has just passed and this disturbance may occur for example in the form of clicking or crackling noises in associated radio equipment.

SUMMARY OF THE INVENTION

It is an object of the invention to provide a zero voltage switch in which the first ignition pulse is triggered as far as possible exactly at the zero axis crossing in order to suppress high frequency disturbance of clicking or crackling noises.

It is a further object of the invention to provide a circuit with which the pulse position of the control pulses can be optimised automatically.

According to a first aspect of the invention, there is provided a zero voltage switch comprising a D.C. current source, first and second parallel connected current branches for taking over the D.C. current from said D.C. current source in half cycles of an A.C. voltage, a third current branch for blocking said first and second current branches in zero axis crossing phases of the A.C. voltage to produce control pulses and a logic unit for controlling said D.C. current source to provide an extremely small current up to the beginning of a first control pulse, an increased current during said control pulses and a current between said extremely small current and said increased current between the control pulses.

According to a second aspect of the invention, there is provided a zero voltage switch, comprising two parallel-connected current branches each one of which takes over a DC current provided by a current source in one half wave of the AC voltage, which current in the zero axis crossing phases of the alternating voltage in which both current branches are blocked, is output via a third current branch in order to produce control pulses wherein a logic unit is present which controls the current provided by said current source such that an extremely small control switch on current flows until the beginning of the first control pulse, this current being increased considerably during the duration of the pulse in the zero axis crossing phases and reduced to a smaller value which is however above the switch on current again in the pauses between pulses.

BRIEF DESCRIPTION OF THE DRAWINGS

The invention will now be described in greater detail, by way of example, with reference to the drawings, in which:

FIG. 1 shows the general construction of the circuit in accordance with the invention;

FIGS. 2a to 2d shows the mains voltage, the switch-on command, the current path of the current supplied by the controlled direct current source and the control pulses;

DESCRIPTION OF THE PREFERRED EMBODIMENTS

Figure 3:
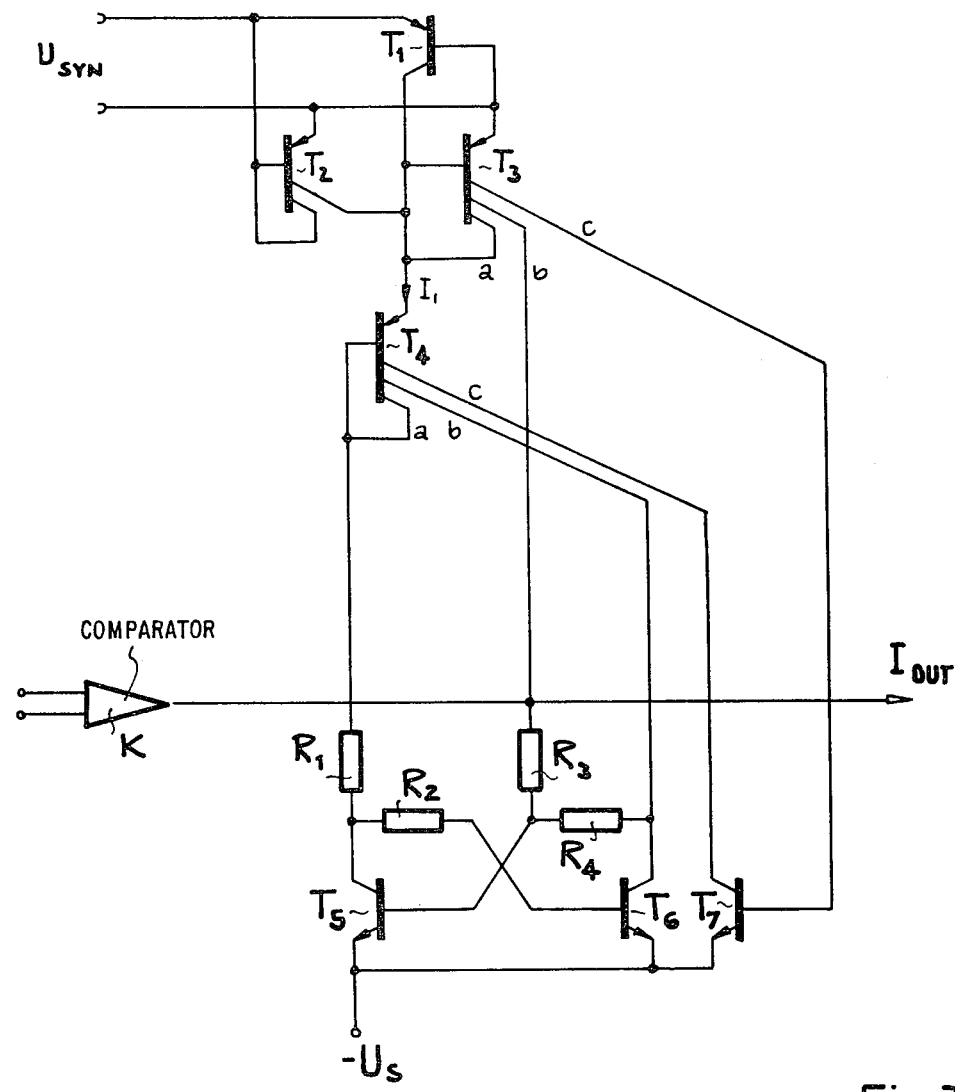
FIG. 3 shows one embodiment of the zero voltage switch.

Basically, the invention proposes in a zero voltage switch of the type described at the outset, to provide a logic unit which controls the current $I_1$ supplied by the current source such that an extremely small switch on current $I_{1/1}$ flows until the beginning of the first control pulse, the said current increasing considerably during the duration of the pulse in the zero axis crossing phases and being reduced again to a smaller value $I_{1/3}$ but which is above the switch on current $I_{1/1}$ in the pauses between pulses.

The invention is based on the knowledge that high frequency disturbance can be safely avoided by triggering the first control pulse in the zero axis crossing as exactly as possible and, at the end of a conductive half wave, the next control pulse only has to occur when the alternating current has dropped to the value of the static holding current of the triac. The control pulse then has to be present until the alternating current has reached a value in the new half wave which corresponds to the dynamic holding current or latching current. This dynamic holding current or latching current is greater than the static holding current approximately by the factor 3. From this it is apparent that the control pulses for the triac are distributed non-symetrically with respect to the zero axis crossing between the out going and the new incoming half wave of the alternating voltage. As a result it is ensured that the triacs are made safely conductive without any unnecessary wastage of current in the triggering circuit until a corresponding switch on command is terminated and the triac as a whole is switched off again.

Therefore the direct current $I_{1/2}$, which is supplied by the controlled current source and flows in the zero axis crossing phases and therefore during the duration of the pulse, determines the alternating current value of the synchronising current (i.e. the alternating current corresponding to voltage in FIG. 2a) and, when this value is reached, the direct current is taken over by one of the two current branches and therefore the control pulse is terminated. However, a direct current $I_{1/3}$ flows during the pauses between pulses due to appropriate automatic control of the current source, said direct current $I_{1/2}$ determining the alternating current value and when this value is reached, the direct current is taken over by the third current branch and therefore a new control pulse is started.

In a refinement of the invention, the current source contains a voltage divider in which the sum of the two resistances of the voltage divider determines the direct current $I_{1/3}$ during the pauses between the pulses whereas only one resistance part of the voltage divider determines the direct current $I_{1/2}$ supplied by the controlled current source during the zero axis crossing phases. As a result it is apparent that the ratio between the direct currents supplied by the controlled current source is determined, during the duration of the pulse and the pauses between pulses, by the sub-division of the voltage divider into two resistance parts.

The zero voltage switch contains a trigger stage, in accordance with a further refinement of the invention, which changes its switching condition during the first zero axis crossing of the alternating voltage after a switch-on command has been released and therefore raises the direct current from its very small switch-on current up to a higher current value, the absolute value of which alternates in accordance with the above comments, between the pauses between pulses and the pulse phase.

Referring now to the drawings, the zero voltage switch of FIG. 1 comprises transistors $T_1$, $T_2$ and $T_3$, the transistors $T_2$ and $T_3$ being multi collector transistors.

A current source Q, controlled by a logic unit, delivers a direct current $I_1$ which can flow out through three different current paths. One current path leads via the collector emitter path of the transistor $T_2$ which takes over the direct current $I_{1/3}$ (FIG. 2c) in the negative half wave of the alternating voltage. In this half wave, the transistor $T_2$ is made conductive since its base potential is below its emitter potential. On the other hand the relationships in the transistor $T_1$ in the negative half wave are the reversed so that this transistor $T_1$ is not conductive. In the case of the transistor $T_2$ one collector is fed back to its base while the other collector of the transistor is connected to the current source Q. In the positive half wave, the transistor $T_1$ is made conductive and therefore takes over the current $I_{1/3}$. The direct current $I_1$ only flows in the zero axis crossing phases, the beginning and end of which depend on the absolute value of the current $I_1$ which is supplied in each case, via the collector emitter path of the transistor $T_3$, at which the respective direct current is reflected via a further collector and is used via a suitable amplifier circuit to produce the output pulse $I_{out}$ in accordance with FIG. 2d. The base of the transistor $T_3$ is connected to the collector which takes over the current $I_1$ while the emitter electrode is connected to the emitter electrode of the transistor $T_2$ and is connected to earth potential.

In FIG. 2a the alternating voltage signal is shown. It is apparent from FIG. 2b that a switch on command $U_S$ occurs during a negative half-wave of the alternating voltage and as a result of this command the control pulses $I_{out}$ in accordance with FIG. 2d are released in the zero axis crossing phases of the alternating voltage for the purpose of making an attached triac conductive. Therefore the direct currents which are apparent from FIG. 2c flow during the individual switching phases of the zero voltage switch. Initially the current source Q emits a very small current $I_{1/1}$ in accordance with FIG. 2c which is so small that during the first zero axis crossing of the alternating voltage the triac is effectively ignited at the zero axis crossing of the alternating voltage after the switch-on command in accordance with FIG. 2b has appeared. The direct current $I_{1/1}$ is dimensioned so that phase 1, which corresponds to the period of time between the exact zero axis crossing of the alternating voltage and when the first ignition pulse occurs, is extremely small. As a result of the low instantaneous value of the mains current which then prevails, high frequency disturbance emanating from the switching process are safely avoided.

At the beginning of the first control pulse in accordance with FIG. 2d, the direct current $I_1$ in FIG. 2c from the current source Q in accordance with FIG. 1 jumps to the value $I_{1/2}$ at the output of the zero voltage switch and the latter value is so large that the control pulse is only safely terminated when the alternating current has reached the value of the latching current of the triac. The resultant period of time between the exact zero axis crossing and switch off of the control pulse is designated Ph 2 (Phase 2) in FIG. 2d and this Phase 2 is substantially longer than Phase 1. Once the control pulse has ended, the direct current $I_1$, which is emitted by the current source Q, falls to the value $I_{1/3}$ in accordance with FIG. 2c, this value being substantially smaller than the current $I_{1/2}$ and being so dimensioned that the next control pulse occurs when the alternating current has reached the value of the holding current of the triac. With this alternating current value, the current $I_1$ jumps to the value $I_{1/2}$ while the next control pulse begins at the same time. The period of time between the beginning of the second control pulse and the exact moment of zero axis crossing of the alternating voltage is designated Phase 3. Ph 3 (Phase 3) in FIG. 2d is substantially longer than Phase 1 since the current $I_{1/3}$ is also substantially greater than the current $I_{1/1}$. Phases 3 and 2 correspond to each other in each case during subsequent control pulses.

The asymmetry of the control pulses relative to the exact moment of zero crossing of the alternating current, which is reflected in the difference between Phase 3 and Phase 2, is a direct consequence of the different currents $I_{1/2}$ and $I_{1/3}$.

In the circuit in accordance with FIG. 3, the transistors $T_1$ and $T_2$ which take over one half-wave of the alternating current in each case, correspond to those of FIG. 1. The direct current $I_1$ supplied by the controlled current source in turn flows through the transistor $T_3$ during the zero axis crossing phases. This transistor $T_3$ has three collectors a, b and c in which the collector a taking over the direct current $I_1$ is connected back to the base of the transistor $T_3$. The collector b of the transistor $T_3$, at which the output pulses are derived, is connected to a store comprising transistors $T_5$ and $T_6$.

The cross coupled transistors $T_5$ and $T_6$ are connected together at their emitter electrodes and are connected to the reference potential $-U_S$. The base of the transistor $T_5$ is connected via a resistor $R_4$ to the collector of the transistor $T_6$ and the base of the transistor $T_6$ is connected via a resistor $R_2$ to the collector of the transistor $T_5$. Furthermore, the resistor $R_1$, which leads to the collector a of the multi collector current image transistor $T_4$ lies in the collector current branch of the transistor $T_5$. The direct current $I_1$ in accordance with FIG. 2c flows through the emitter path of the transistor $T_4$. The collector a of the transistor $T_4$ is connected back to the base and connected to the resistor $R_1$, and the collector b of the transistor $T_4$ leads to the collector of the transistor $T_6$ and the collector c leads to the collector of a transistor $T_7$, the emitter electrode of which also lies at the potential $-U_S$. The base of this transistor $T_7$ is connected to the collector c of the transistor $T_3$.

This circuit operates as follows:

A comparator K compares a reference voltage, for example, with the voltage supplied by a sensor and switches the output of the comparator either to the reference potential $-U_S$ or ensures a floating output potential. The zero voltage switch does not deliver any ignition pulses for the connected triac as long as the reference potential is at the comparator output. Since reference potential is then at the resistor $R_3$ the transistor $T_5$ remains blocked and the transistor $T_6$ of the store is made conductive. The current $I_{1/1}$ flowing through the transistor $T_4$ is then determined substantially by the voltage divider $R_1$ and $R_2$. In which:

$$I_{1/1} = \frac{U_S - U_{BET4} - U_{BET6}}{R_1 + R_2} \times 2,$$

where $U_{BET4}$ and $U_{BET6}$ are the base emitter voltages of the conductive transistors $T_4$ and $T_6$. The multiplication factor 2 arises from the fact that the current flowing through $R_1$ and $R_2$ is reflected in the collector b of the transistor $T_4$ so that when the collectors a and b of the transistor $T_4$ are the same size, the current $I_{1/1}$ is twice as large as the current which only flows through $R_1$ and $R_2$. The collector c of the transistor $T_4$ is without current since the transistor $T_7$ remains blocked when there are no output pulses.

If, in accordance with FIG. 2b the comparator output is switched over within one half-wave of the alternating current, the very small current $I_{1/1}$ which is still flowing may flow through that transistor $T_1$ or $T_2$ which is connected respectively until close to the moment of zero axis crossing of the alternating voltage. Only when the alternating current reaches the value $I_{1/1}$ does the transistor $T_3$ take over this current and the trigger stage comprising transistors $T_5$ and $T_6$ is switched over at the same time via the collector b of the transistor $T_3$. Since the potential at the resistor $R_3$ is now able to float, the transistor $T_5$ is conductive and the transistor $T_6$ is blocked. Thus the direct current $I_1$ only flows through the resistor $R_1$ and the collector emitter path of the transistor $T_5$. At the same time a current driving the transistor $T_7$ will flow through the collector c of the transistor $T_3$ so that a current flow is now possible through the collector c of the transistor $T_4$. The following applies for the current $I_1$ during the zero axis crossing phase:

$$I_1 = \frac{U_S - U_{BET3} - U_{BET4} - U_{CEsatT5}}{R_1} \times 3,$$

where $U_{BET3}$ and $U_{BET4}$ are the base emitter voltages of the conductive transistors $T_3$ and $T_4$, and $U_{CEsatT5}$ is the saturation voltage of the transistor $T_5$. The multiplication factor 3 arises from the fact that all of the collectors a,b and c of the transistor $T_4$ now conduct current so that the current flowing solely through $R_1$ flows through the emitter of the transistor $T_4$ in trebled form when the collectors a b and c of the transistors $T_4$ are of equal size. This current $I_{1/2}$ is greater than or equal to the latching current of the triac. As a result, it is ensured that the triac is conductive until the alternating current exceeds the latching current. If this point in time is reached at the end of Phase 2, then the direct current $I_1$ flows back through one of the transistors $T_1$ or $T_2$. The transistor 3 is therefore blocked so that the transistor $T_7$ is switched off via the collector c of this transistor $T_3$. Current is no longer able to flow through the collector c of the transistor $T_4$. In the time during the pauses between pulses, the current $I_{1/3}$ flows and the following is true for this current:

$$I_1 = \frac{U_S - U_{BET4} - U_{CEsatT5}}{R_1} \times 2$$

The multiplication factor 2 arises from the fact that the collectors a and b of the transistor $T_4$ conduct current while the collector c is cut off. Now an alternating exchange of current takes place between the values $I_{1/2}$ and $I_{1/3}$ in accordance with FIG. 2c and these different current values cause the different distribution of the pulse width between Phase 2 and Phase 3 in accordance with the signal diagram of FIG. 2d.

In a suitable embodiment, the current $I_{1/1} = 3$ μa so that the switch on flank (i.e. current rise of the control pulse) of the triac is extremely small. The current $I_{1/2}$ is 40 μa while the current $I_{1/3}$ is 16 μa for example. As a result, a ratio of $t_3$ to $t_2$ of approximately 1:3 is produced, in which $t_3$ is the duration of Phase 3 and $t_2$ is the duration of Phase 2 in accordance with FIG. 2d.

Figure 4:
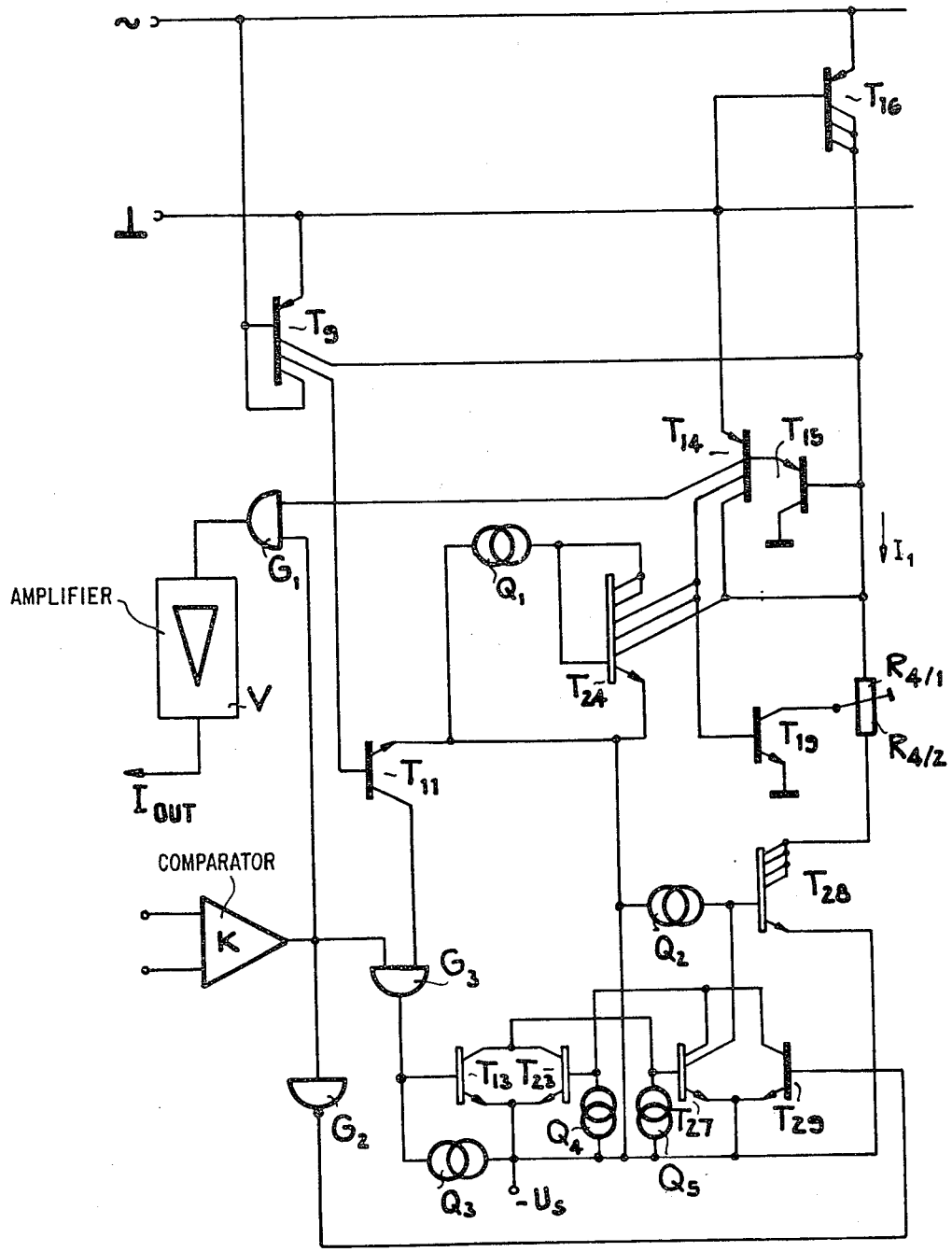
FIG. 4 shows an embodiment of the zero voltage switch which has been implemented partly using I²L techniques.

In the embodiment in accordance with FIG. 4 the transistors $T_9$ and $T_{16}$ correspond to the transistors $T_2$ and $T_1$ of FIG. 3. The transistor $T_{14}$ corresponds to the transistor $T_3$ and takes over the current $I_1$ in the zero axis crossing phases, this current flowing either through a transistor $T_{24}$ or through a voltage divider $R_4$. Transistor $T_{14}$ is connected in series with transistor $T_{15}$ in the form of an emitter follower to produce signal amplification. Transistor $T_{15}$ may thus be considered a unit with transistor $T_{14}$. The voltage divider $R_4$ is sub-divided into resistor parts $R_{4/1}$ and $R_{4/2}$. The collector of the transistor $T_{19}$ is connected to the voltage tapping and is triggered at the base end via a double collector of the multi-collector transistor $T_{24}$.

As long as there is no "switch on" command at the comparator output K, the direct current $I_{1/1}$ always flows through a collector of the transistor $T_{24}$ and is therefore small. This current $I_{1/1}$ is mirrored in the zero axis crossing phases by $T_{14}$ via a second collector output; but this current is not sufficient to make the transistor $T_{19}$ conductive while the collector of the transistor $T_{19}$ is connected to the tapping of the voltage divider $R_4$. When the "switch on" command is not there the reference potential appears at the output of the comparator so that a transistor $T_{13}$ of a store is blocked. A subsequently connected transistor $T_{27}$ is made conductive and in turn blocks a transistor $T_{28}$ which is connected after the transistor $T_{27}$. From this it is apparent that the current $I_{1/1}$ cannot flow through the voltage divider $R_4$. A switching command which requires a positive potential at the comparator output occurs in the negative half-wave of the alternating current. During this time, the current $I_{1/1}$ flows straight through the transistor $T_9$ so that a transistor $T_{11}$ connected at its base to a collector of transistor $T_9$ remains conductive via the current mirrored at the transistor $T_9$. As a result the store does not change its state in the out going negative half-wave since the transistor $T_{13}$ cannot be made conductive.

Only when the negative half-wave finishes and the current $I_{1/1}$ is achieved and flows through the transistor $T_{14}$, is the transistor $T_{11}$ blocked. As a result, the transistor $T_{13}$ is able to conduct via the AND gate $G_3$ which has inputs connected respectively to the output of comparator K and the collector of transistor $T_{11}$. As a result, the transistor $T_{27}$ which is connected thereafter is blocked and a transistor $T_{28}$ which is connected after the transistor $T_{27}$ is conductive. Thus a current flow through the collector emitter path of the transistor $T_{28}$ is possible and therefore current flow is also possible via the voltage divider $R_4$. As a result the current $I_1$ increases so that the current mirrored at the transistor $T_{14}$ in the zero axis crossing phase increases and is now sufficient to make the transistor $T_{19}$ conductive. As a result current flowing through the resistor part $R_{4/2}$ is suppressed and the resistor part $R_{4/1}$ only determines the current $I_{1/2}$ flowing during the duration of the pulse.

When a transistor $T_{16}$ takes over the current $I_1$ in the rising positive half-wave, the state of the store does not change at all so that the transistor $T_{28}$ remains operative. Since the transistor $T_{14}$ no longer conducts the current, the transistor $T_{19}$ is also blocked again so that the direct current $I_1$ has to flow through both resistor parts of the voltage divider $R_4$. The sum of the resistor parts $R_{4/1}+R_{4/2}$ therefore determines a current $I_{1/3}$ during the pauses between pulses and this current is substantially smaller than the current $I_{1/2}$ (FIG. 2c).

Resetting the store takes place by means of an inverter $G_2$ and a transistor $T_{29}$, the collector emitter path of which is connected in parallel with the collector/emitter path of the transistor $T_{27}$. If the comparator output comprises the reference potential, this signal is inverted by inverter $G_2$ so that a transistor $T_{29}$ is made conductive. As a result, the transistor $T_{23}$, which is triggered at its base by the collector of the transistor $T_{29}$, is blocked. In the same way, the transistor $T_{28}$ is blocked so that current flow through the voltage divider $R_4$ is prevented. The output signal $I_{out}$ is coupled out via a collector of the transistor $T_{14}$ which conducts current in the zero axis crossing phases. In order that an output signal should only occur when a corresponding "switch on" command is present, the collector of $T_{14}$ passes current to an AND gate $G_1$, the second input of which is connected to the comparator output. Only when there is a "switch on" command and at the same time there is current flow through the transistor $T_{14}$ can an output signal $I_{out}$ in accordance with FIG. 2d be emitted by the amplifier V.

The transistor $T_9$, $T_{16}$ and $T_{14}$ in accordance with FIG. 4 are multi-collector current image transistors.

The transistors $T_{24}$, $T_{28}$ and $T_{27}$ are implemented using $I^2L$ techniques. The transistors $T_{13}$, $T_{23}$ are also $I^2L$ transistors. Accordingly, the current sources $Q_1$, $Q_2$, $Q_3$, $Q_4$ and $Q_5$ are inserted into the view of FIG. 4.

It will be understood that the above description of the present invention is susceptible to various modification changes and adaptations.

What is claimed is:

1. A zero voltage switch connected to an AC voltage source which produces an AC voltage, said switch comprising a DC current source producing a DC current, first and second parallel connected current branches connected to said DC current source and the AC voltage source for taking over the DC current from said DC current source in half cycles of the AC voltage, a third current branch connected to said first and second parallel connected branches and said DC current source for blocking said first and second current branches in zero axis crossing phases of the AC voltage to produce control pulses and a logic unit connected to said DC current source for controlling said DC current source to provide an extremely small current up to the beginning of a first control pulse, an increased current during said control pulses and a current between said extremely small current and said increased current between the control pulses.

2. A zero voltage switch for producing control pulses during zero axis crossing phases of an alternating voltage, said switch comprising:
   a controllable direct current source providing a direct current;
   first and second parallel-connected current branch means each being coupled to the alternating voltage and connected to said current source for conducting the direct current during a respective one of the positive and negative half waves of the alternating voltage and not conducting the direct current during the zero axis crossing phases of the alternating voltage;
   third current branch means connected to said current source for conducting the direct current in the form of control pulses during the zero axis crossing phases of the alternating voltage; and
   logic means connected to said current source for controlling the direct current provided by said current source so that a relatively small switch-on direct current flows until the beginning of a first control pulse, a considerably increased direct current flows during the period of the first and all subsequent control pulses, and a reduced current that has a value between the switch-on direct current and the considerably increased direct current flows during the time between control pulses.

3. A zero voltage switch as defined in claim 2, wherein the alternating voltage has a corresponding alternating current and said logic means includes means for causing one of said first and second current branch means to conduct the direct current when the alternating current reaches a value as determined by the value of the direct current that flows during the period of the control pulses and for causing said third current branch means to conduct the direct current when the alternating current reaches a value as determined by the value of the direct current that flows during the time between the control pulses.

4. A zero voltage switch as defined in claim 3, in combination with a switching device having a static holding current and a dynamic holding current which is approximately two to three times the static holding current, wherein said logic means controls the direct current during the period of a control pulse to be two to three times greater than during the time between control pulses in accordance with the dynamic current of the switching device and controls the direct current during the time between control pulses to correspond at least to the value of the static holding current of said switching device.

5. A zero voltage switch as defined in claim 2, wherein said logic means controls the switch-on current to be so small that the current rise at the initiation of the first control pulse produces no noticeable high frequency disturbance.

6. A zero voltage switch as defined in claim 2, wherein said logic means includes means for triggering a switch-on command and a trigger stage having switching states which are changed during the first zero axis crossing of the alternating current after the switch-on command has been triggered for raising the direct current from the small switch-on current to the increased current.

7. A zero voltage switch as defined in claim 6, wherein the alternating voltage has a corresponding alternating current and said logic means includes a voltage divider means coupled to the direct current and a transistor controlled by the alternating current for causing the trigger stage to change its switching state upon the occurrence of a switch-on command only at the end of the negative half-wave of the alternating voltage for enabling said voltage divider means to conduct the direct current.

8. A zero voltage switch as defined in claim 2, wherein said logic means includes a voltage divider means which has two resistance parts connected for determining the direct current between control pulses and the direct current during the zero axis crossing phases.

9. A zero voltage switch as defined in claim 8, wherein said logic means includes a switching unit for determining respective connections of the resistance parts of said voltage divider means and said third current branch means includes a multi-collector current image transistor having a collector emitter path and including a collector connected to said switching unit.

10. A zero voltage switch as defined in claim 9, wherein said voltage divider means includes a tap and lies in the path of the direct current, and said switching unit includes a post-connected transistor and a multi-collector current image transistor having at least one collector connected to the base of said post-connected transistor, said post-connected transistor having a collector connected to the tap of said voltage divider means.

11. A zero voltage switch as defined in claim 10, wherein said logic means includes means for triggering a switch-on command, a store means having switching states that change from one state to the other during the zero axis crossing phase of the alternating voltage which follows the switch-on command, said store means being connected for coupling said voltage divider means to a voltage potential which allows the direct current to flow through said voltage divider means when said store changes states, said current image transistor of said switching unit is constructed and connected to conduct the switch-on direct current when said voltage divider means is disconnected, said post-connected transistor is connected to be rendered conductive during the zero axis crossing phases of the alternating voltage, the direct current during said zero axis crossing phases being determined by one of said resistance parts of said voltage divider means, and said post-connected transistor is connected so that it is blocked during the time between the zero axis crossing phases, the direct current between the zero axis crossing phases being determined by both resistance parts of said voltage divider means.

* * * * *